United States Patent [19]

Kawanami et al.

[11] Patent Number: 4,755,685
[45] Date of Patent: Jul. 5, 1988

[54] ION MICRO BEAM APPARATUS

[75] Inventors: Yoshimi Kawanami, Kokubunji; Tohru Ishitani, Sayama; Kaoru Umemura, Kokubunji; Hifumi Tamura, Hachioji, all of Japan

[73] Assignee: Hitachi, Ltd., Tokyo, Japan

[21] Appl. No.: 919,461

[22] Filed: Oct. 16, 1986

[30] Foreign Application Priority Data

Oct. 16, 1985 [JP] Japan .................. 60-228688

[51] Int. Cl.$^4$ ............... H01J 37/30; H01J 37/317
[52] U.S. Cl. ..................... 250/492.2; 250/396 ML
[58] Field of Search .......... 250/396 R, 396 ML, 398, 250/492.2, 492.21, 492.3

[56] References Cited

U.S. PATENT DOCUMENTS

| | | | |
|---|---|---|---|
| 4,019,989 | 4/1977 | Hazewindus et al. | 250/396 ML |
| 4,191,887 | 3/1980 | Brown | 250/396 ML |
| 4,461,034 | 7/1984 | Okamura et al. | 250/492.2 |
| 4,563,587 | 1/1986 | Ward et al. | 250/396 R |

FOREIGN PATENT DOCUMENTS

| | | | |
|---|---|---|---|
| 0107320 | 5/1984 | European Pat. Off. | |
| 8501389 | 3/1985 | World Int. Prop. O. | 250/492.2 |
| 1523458 | 8/1978 | United Kingdom. | |
| 2101808 | 1/1983 | United Kingdom. | |

OTHER PUBLICATIONS

Prewett, Focused Ion Beam Systems for Materials Analysis and Modification, Vacuum, vol. 34, No. 10/11, pp. 391-399, (1984).

Primary Examiner—Bruce C. Anderson
Assistant Examiner—Paul A. Guss
Attorney, Agent, or Firm—Antonelli, Terry & Wands

[57] ABSTRACT

In an ion micro beam apparatus which consists of an ion source, a beam focusing system which accelerates, focuses, mass-separates and deflects the ions emitted from said ion source, and a specimen plate for finely moving the specimen, the improvement comprising a mass separator which is constituted by: at least two stages of focusing lenses in said beam focusing system; four stages of E×B deflectors arranged between the two stages of lenses, each of said E×B deflectors being comprised of a pair of electrodes and a pair of magnetic pole pieces to generate an electric field and a magnetic field in the directions perpendicular to an ion optical axis, wherein among the four stages of E×B deflectors, the electric fields and magnetic fields generated by the E×B deflectors of the second and third stages as counted from the side of the ion source are set to be in parallel with, but opposite to, the electric field and magnetic field generated by the E×B deflector of the first stage, and the electric field and magnetic field of the E×B deflector of the fourth stage are set to be in parallel with, and in the same directions as, the electric field and magnetic field generated by the E×B deflector of the first stage; and a mass separating aperture which is located between the E×B deflector of the second stage and the E×B deflector of the third stage as counted from the side of the ion source, to mass-separate the ions.

7 Claims, 3 Drawing Sheets

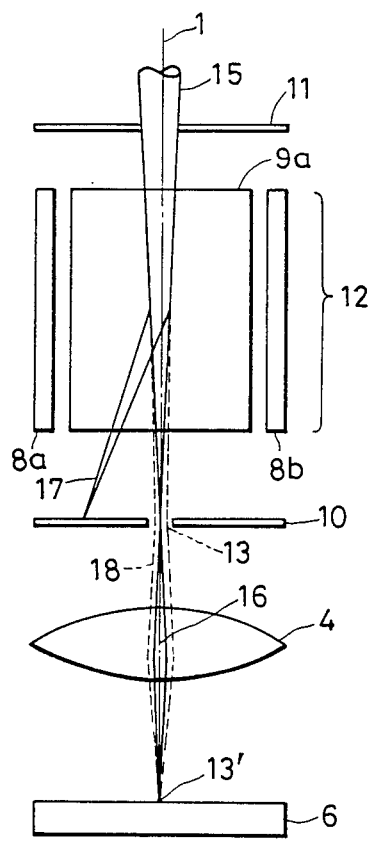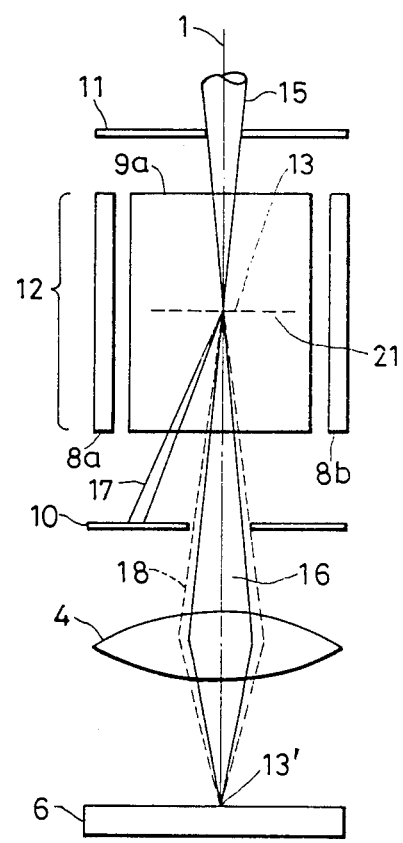

ION MICRO BEAM APPARATUS

BACKGROUND OF THE INVENTION

The present invention relates to the improvements in an ion micro beam apparatus which is used for ion micro analysis, ion micro doping, ion beam writing, and the like.

The ion micro beam apparatus irradiates the specimens with an ion beam which is finely focused into a beam diameter of about 1 μm or smaller, and is expected to be adapted to a microfabrication process for producing semiconductor elements. The ion source consists of a point optical source having a high brightness, such as a liquid metal ion source, a field ionization ion source, a duoplasmatron, or the like. In particular, when several kinds of ions are obtained by employing, for example, the liquid metal ion source which turns an alloy into ionized substances, it is necessary to use a mass separator in order to select and separate ions of a desired kind.

FIG. 1 illustrates a conventional ion micro beam apparatus which chiefly consists of an ion source 2 having a high brightness, electrostatic lenses 3 and 4 which so focus an ion beam 15 emitted therefrom that an object 14 is projected onto images 13 and 13' along an optical axis 1, an electrostatic deflector 5 which deflects the ion beam on a specimen plate 6, and an E×B mass filter 7 which is a mass separator installed between the two electrostatic lenses 3 and 4. The E×B mass filter 7 consists of an E×B deflector 12 which is made up of electrodes 8a, 8b and a magnetic pole 9a to mass-separate the ion beam, and a mass separating aperture 10 to take out desired ions only. An aperture 11 restricts the ion beam current.

The mass separator in an ion micro beam apparatus should have a high mass resolution to remove ions of undesired kinds and, at the same time, should not adversely affect the beam focusing performance. The E×B mass filter 7 used as a mass separator enables the optical system to be linearly arranged, and makes it easy to carry out the design and axis alignment. However, the E×B mass filter 7 cannot sufficiently satisfy the above-mentioned two requirements simultaneously due to chromatic aberration. The reasons will be described below briefly.

An example which employs an E×B mass filter has been taught in Ishitani et al., "Mass-Separated Microbeam System with a Liquid-Metal-Ion Source", Nucl. Instr. and Meth. 218 (1983) 363.

First, the operation principle of the E×B mass filter will now be explained in conjunction with FIG. 2. The basic structural elements of the E×B mass filter include an E×B deflector 12 which consists of a pair of electrodes 8a, 8b and a pair of magnetic pole pieces 9a, 9b (9b is not diagramed) to generate an electric field E and a magnetic field B in the directions perpendicularly to the ion optical axis 1, respectively, and a mass separating aperture 10 of a subsequent stage. The ions incident along the ion optical axis 1 at an acceleration voltage $V_0$ proceed straight when the masses thereof satisfy the following condition and pass the mass separating aperture 10, i.e., $$(2eV_0/m)^{\frac{1}{2}} = E/B \quad (1)$$

On the other hand, ions of which the masses are different by $\Delta m$ are deflected on the aperture 10 by $\Delta Xm$ toward the direction of the electric field E from the optical axis 1, i.e., $$\Delta Xm = (\Delta m/m)(E/V_0)Lm(Ld+Lm/2)/4 \quad (2)$$

Further, if the emitted ion energy spread of the ion source is $\Delta V$, ions of the mass m are also deflected by $\Delta Xc$.

This becomes important when the acceleration voltage is low or when the ion source consists of a liquid metal ion source having a large energy spread.

$$\Delta Xc = (\Delta V/V_0)(E/V_0)Lm(Ld+Lm/2)/4 \quad (3)$$

From the above equation (2), the mass resolution (m/Δm) of the E×B mass filter can be defined as follows:

$$(m/\Delta m) = Lm/\gamma A(E/V_0)(Ld+Lm/2)/4 \quad (4)$$

where γA denotes the width of the aperture 10.

Further, there exists an upper limit in the mass resolution since the beam has a width on the aperture 10 due to a finite aperture angle of the incident ion beam. That is, when $\gamma A \simeq d$, in the equation (4), d denotes a beam width. Therefore, the mass resolution of the E×B mass filter is affected by the optical system of the preceding stage.

The above-mentioned problem will now be described with reference to FIG. 3 which illustrates the E×B mass filter used in the practical ion micro beam apparatus. FIGS. 3A and 3B illustrate the case where the incident ion beam 15 is focused on the central surface 21 of the E×B deflector 12 (FIG. 3B) by the lens of the preceding stage that is not shown, and the case where the incident ion beam 15 is focused on the mass separating aperture 10 (FIG. 3A).

In the case of FIG. 3B, the beam 16 is slightly spread as denoted by 18 due to ΔXc of the equation (3). However, the beam focusing performance is not adversely affected since the chromatic aberration at the focal point 13 is cancelled (this has been disclosed in detail, for example, in Japanese Patent Laid-Open No. 7550/1984). The mass resolution, however, is considerably small. In the case of FIG. 3A, ΔXc of the equation (3) serves as chromatic aberration at the focal points 13, 13' to greatly deteriorate the beam focusing performance. In particular, ΔXc does not change depending upon the aperture angle of the beam, and cannot be removed even if the aperture is inserted at the back of the lens 4. However, the beam is focused on the mass separating aperture 10, and the beam diameter is nearly equal to ΔXc. Therefore, the mass resolution is greater than that of the case of FIG. 3B.

Using the conventional E×B mass filter, as described above, it was not possible to remove the chromatic aberration and to fulfill high mass resolution as well as high beam focusing performance, simultaneously.

To cope with this problem, there has been proposed an example which employs a mass separator consisting of magnetic field filters of four stages (P. D. Prewett, Vacuum, 34, 931, 1984). This method can cancel the chromatic aberration, can focus the beam on the mass separating aperture, and offers the probability that high mass resolution can be obtained. However, since the ion trajectory is greatly deviated from the straight line due to the magnetic field, the astigmatism becomes great (the astigmatism correctors must be provided in the preceding and succeeding stages). Moreover, the mass resolution varies greatly depending not only upon the size of the mass separating aperture but also upon its position, and it becomes difficult to set the mass resolution. With this mass separator, furthermore, the magnetic field must be varied using electromagnets that are difficult to assemble in small sizes.

SUMMARY OF THE INVENTION

The object of the present invention is to provide an ion micro beam apparatus which has high mass resolution, and which is equipped with a mass separator that imparts little chromatic aberration to the beam.

In order to achieve the above object, the present invention deals with an ion micro beam apparatus which comprises four stages of E×B deflectors arranged between two stages of lenses in a beam focusing system wherein among the four stages of E×B deflectors, the electric fields and magnetic fields generated by the E×B deflectors of the second and third stages as counted from the side of the ion source are set to be in parallel with, but opposite to, those of the E×B deflector of the first stage, and the electric field and magnetic field of the E×B deflector of the fourth stage are set to be in parallel with, and in the same directions as, those of the E×B deflector of the first stage, and further comprises a mass separating aperture between the E×B deflector of the second stage and the E×B deflector of the third stage as counted from the side of the ion source.

Owing to such a characteristic structure of the present invention, the mass separator of the ion micro beam apparatus focuses the beam on the mass separating aperture to maximize the mass resolution without producing chromatic aberration.

BRIEF DESCRIPTION OF THE DRAWINGS

FIGS. 3A and 3B are diagrams to explain the operation modes of the E×B mass filter;

DETAILED DESCRIPTION OF THE PREFERRED EMBODIMENTS

Figure 1:
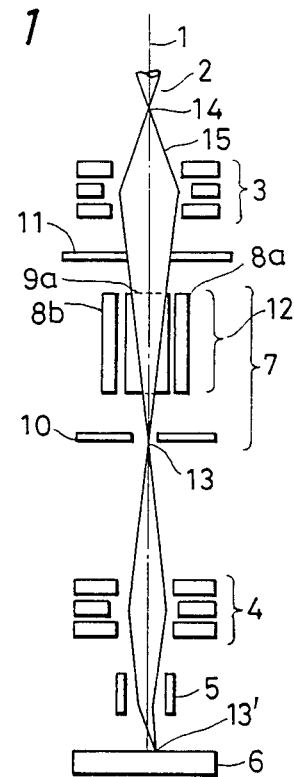
FIG. 1 is a vertical section view of an optical system in a conventional ion micro beam apparatus.
Figure 2:
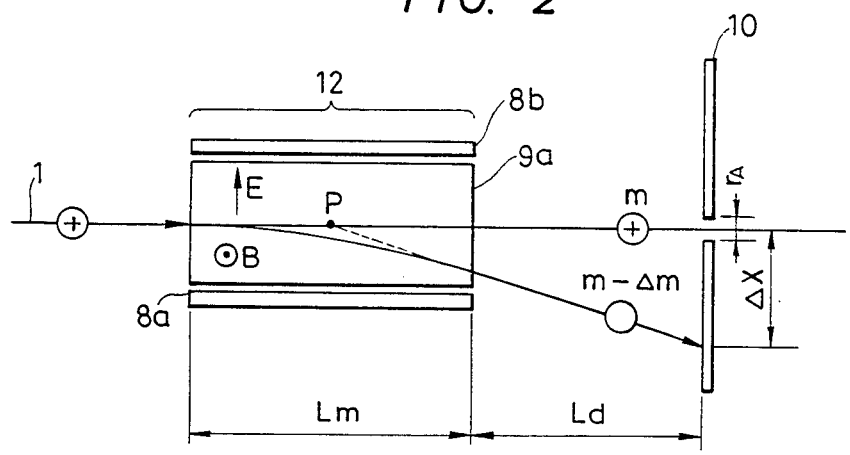
FIG. 2 is a schematic diagram which illustrates the principle of an E×B mass filter.

Embodiments of the present invention will now be described in conjunction with the drawings.

First, the principle of the invention will be described in conjunction with FIG. 5 which schematically illustrates a mass separator in an ion micro beam apparatus of the present invention. In the E×B deflectors $12a$, $12b$, $12c$ and $12d$ of four stages, directions of the magnetic field $B_n$ and electric field $E_n$ are selected as shown, and a relationship of their intensities is given by $$E_n/B_n = (2eV_0/m)^{\frac{1}{2}} \quad (5)$$

(where $n = 1, 2, 3, 4$)

An ion having a mass m and an acceleration energy $eV_0$ which is incident upon the mass separator along an ion optical axis 1, proceeds straight along the ion optical axis, and passes through the mass separating aperture 10 on the ion optical axis 1. Here, lengths of the E×B deflectors $12a$, $12b$, $12c$ and $13d$ in the direction of the ion optical axis 1 are denoted by $L_1$, $L_2$, $L_3$ and $L_4$, respectively, the distance between the center surface of the E×B deflector $12a$ and the E×B deflector $12b$ is denoted by $L_{12}$, and the distance between the center surfaces of the E×B deflector $12c$ and the E×B deflector $12d$ is denoted by $L_{34}$.

There further hold the following relationships:

$$E_1 L_1 = E_2 L_2 \quad (6)$$

$$E_3 L_3 = E_4 L_4 \quad (7)$$

$$E_1 L_1 L_{12} = E_3 L_3 L_{34} \quad (8)$$

An ion having a mass different by $\Delta m$ from the ion having the mass m is deflected on the mass separating aperture 10 toward the direction of the electric field $E_2$ by $$\Delta X_M = \left(\frac{\Delta m}{m}\right)\left(\frac{E_1}{4V_0}\right) L_1 L_{12} \quad (9)$$

under the same conditions through the E×B deflectors $12a$ and $12b$, and is hence mass-separated by the mass separating aperture 10.

On the other hand, the ion having the acceleration energy $e(V_0 + \Delta V)$ and the mass m is slightly deflected on the mass separating aperture 10 toward the direction of the electric field $E_2$ by $$\Delta Xc = \left(\frac{\Delta V}{V_0}\right)\left(\frac{E_1}{4V_0}\right) L_1 L_{12} \quad (10)$$

under the same incident conditions through the E×B deflectors $12a$ and $12b$ due to the emitted ion energy spread of the ion source. Here, however, if the opening of the mass separating aperture 10 is selected to be greater than $\Delta Xc$, the ion passes through the aperture and is returned back onto the ion optical axis 1 through the E×B deflectors $12c$ and $12d$. In the subsequent stage of the mass separator, therefore, there is no chromatic aberration caused by the mass separator. Namely, if the incident ion beam is focused on the mass separating aperture 10 by the front and rear lenses that are not shown, the mass separator exhibits a maximum mass resolution as given by, $$\frac{\Delta m}{m} = \left(\frac{E_1}{4V_0}\right) \frac{L_1 L_{12}}{\gamma A}, \gamma A \geq d + \Delta Xc \quad (11)$$

without chromatic aberration.

In the above equation, symbol d denotes a diameter of the incident ion beam at the position of the mass separating aperture 10 when there is no mass separator. Further, symbol $\gamma A$ denotes the size of the mass separating aperture 10.

An embodiment of the present invention will now be explained in conjunction with FIGS. 4 and 5.

Figure 4:
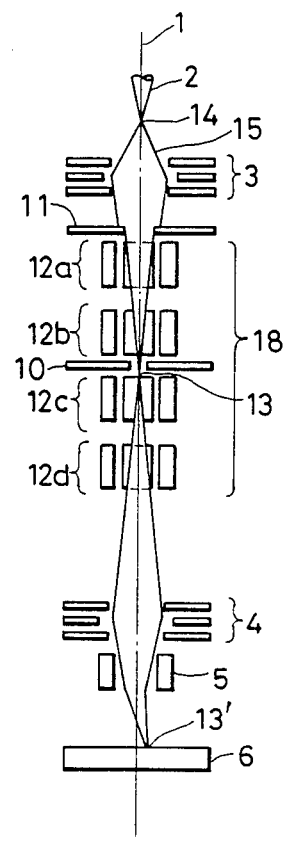
FIG. 4 is a vertical section view of an optical system in an ion micro beam apparatus according to the present invention.

FIG. 4 shows an ion micro beam apparatus equipped with a mass separator 18 which consists of four stages of E×B deflectors $12a$, $12b$, $12c$ and $12d$ of an equal size arranged between two stages of lenses 3 and 4 in the beam focusing system, and a mass separating aperture 10 which has an opening on the ion optical axis, according to an embodiment of the present invention.

In this embodiment, the lens 3 is so adjusted that an ion beam 15 is focused on a focal point 13 on the mass separating aperture 10, and the lens 4 is so adjusted that an image on the focal point 13 on the mass separating aperture 10 is projected onto a focal point 13' on the specimen plate 6.

Figure 5:
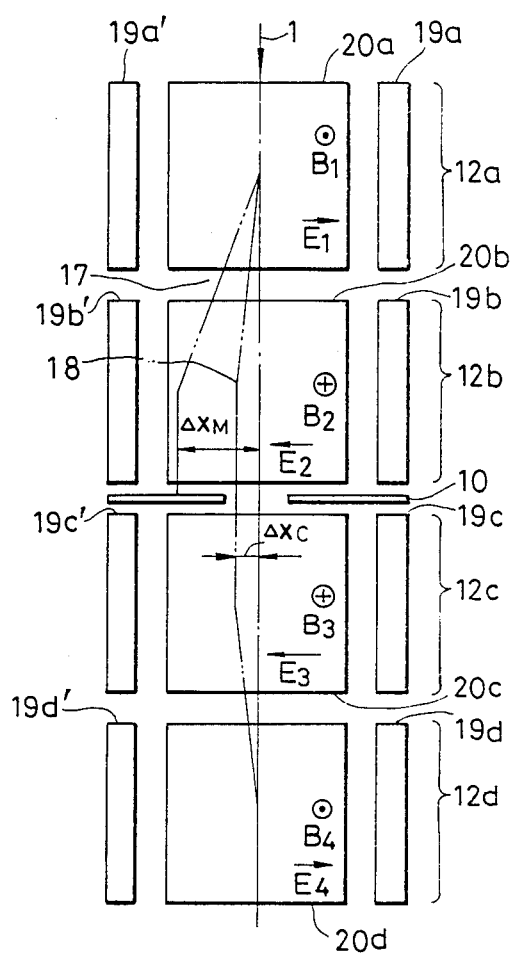
FIG. 5 is a schematic diagram which explains the operation of a mass separator according to the present invention.

The electric field and magnetic field in the mass separator 18 according to this embodiment have been formed in the directions as shown in FIG. 5, and have been so asjusted that $E_1 = E_2 = E_3 = E_4 \equiv E$, and $B_1 = B_2 = B_3 = B_4 \equiv B$. Here, the magnetic pole pieces 20a, 20b, 20c and 20d are all constituted by permanent magnets, the intensity of the magnetic field is fixed, and the kind of ions is selected by changing the intensity E of the electric field. Therefore, only the ion having mass, i.e., $$m = 2eV_0 \left(\frac{B}{E}\right)^2 \quad (13)$$

(Symbols are as defined in the equation (6)) is allowed to proceed straight on the ion optical axis 1, and can be mass-separated maintaining a mass resolution, $$\frac{\Delta m}{m} = \left(\frac{E}{4V_0}\right)\frac{L_1 L_{12}}{\gamma A}, \gamma A \geqq d + \Delta Xc \quad (14)$$

The beam spread $\Delta Xc$ on the mass separating aperture 10 caused by the emitted ion energy spread of the ion source returns to the initial value when the ions have left the mass separator. If mentioned by way of concrete numerical figures, the beam spread $\Delta Xc$ on the mass separating aperture 10 caused by the emitted ion energy spread $\Delta V$ of the ion source when m=71 becomes as given below, i.e., $$\Delta Xc = \left(\frac{\Delta V}{V_0}\right)\frac{L_1 L_{12}}{4}\left(\frac{2e}{mV_0}\right)^{\frac{1}{2}} B = 0.13 \ \mu m$$

$$d + \Delta Xc \approx d$$

under the conditions where B=0.5T, $L_1$=25 mm, $L_{12}$=40 mm, $V_0$=100 KV, $\Delta V$=20 V, and d=1 μm. If the mass separating aperture 10 has a size $\gamma A$=5 μm, then $\gamma A > d + \Delta Xc$, and the mass resolution becomes as great as, $$\frac{\Delta m}{m} = \left(\frac{2e}{mV_0}\right)^{\frac{1}{2}} B \frac{L_1 L_{12}}{4\gamma A} = 132$$

According to this embodiment as described above, the mass separator in the ion micro beam apparatus exhibits a high mass resolution without developing chromatic aberration, contributing to increase the beam focusing performance. In this embodiment, furthermore, the mass separator does not use electromagnets. Therefore, the mass separation can be controlled at high speeds, and the ion micro beam apparatus is constructed in a small size to reduce the consumption of electric power.

The above embodiment has employed four stages of E×B deflectors 12a, 12b, 12c and 12d of the same size. However, the same effects can be obtained even when the four stages of E×B deflectors have dissimilar sizes, provided the relationships of the equations (6) to (8) are satisfied.

In the above embodiment, furthermore, magnetic pole pieces of the four stages of E×B deflectors 12a to 12d were constituted by permanent magnets. However, the magnetic pole pieces may be replaced by electromagnets, or electromagnets for correction may be attached thereto to obtain the same effects.

In the above embodiment, the mass separating aperture 10 was formed on the ion optical axis 1. However, the position of the mass separating aperture 10 may be slightly deviated toward the direction of the electric field $E_1$ to obtain the same high mass resolution and the same effect for removing chromatic aberration.

According to the present invention, the mass separator exhibits a high mass resolution and a small chromatic aberration, enabling the ion micro beam apparatus to produce improved performance (increased beam purity and increased beam focusing performance).

According to the ion micro beam apparatus of the present invention, furthermore, the mass separator does not use electromagnets, contributing to reduce the size and to reduce the consumption of electric power.

What is claimed is:

1. In an ion micro beam apparatus comprising an ion source, a beam focusing system which accelerates, focuses, mass-separates and deflects the ions emitted from said ion source, and a specimen plate for finely moving the specimen, the improvement comprising a mass separator including:

at least two stages of focusing lenses in said beam focusing system;

four stages of E×B deflectors arranged between the two stages of lenses, each of said E×B deflectors having a pair of electrodes and a pair of magnetic pole pieces to generate an electric field and a magnetic field, respectively, in directions perpendicular to an ion optical axis, wherein among the four stages of E×B deflector, the electric fields and magnetic fields generated by the E×B deflectors of the second and third stages as counted from the side of the ion source are in parallel with, but opposite to, the electric field and magnetic field generated by the E×B deflector of the first stage, the electric field and magnetic field of the E×B deflector of the fourth stage are in parallel with, and in the same directions as, the electric field and magnetic field generated by the E×B deflector of the first stage, and the electric field and magnetic field of the E×B deflector of the four stages have such intensities that an ion beam incident on the E×B deflector of the first stage along the ion optical axis goes out of the E×B deflector of the fourth stage along the ion optical axis; and a mass separating aperture means located between the E×B deflector of the second stage and the E×B deflector of the third stage as counted from the side of the ion source, to mass-separate the ions.

2. An ion micro beam apparatus according to claim 1, wherein magnetic pole pieces of said four stages of E×B deflectors are all constituted by permanent magnets.

3. An ion micro beam apparatus according to claim 1, wherein said four stages of E×B deflectors have substantially the same size, and the E×B deflectors generate substantially the same electric field and the magnetic field.

4. An ion micro beam apparatus according to claim 1, further comprising means for changing the electric field intensity of each of the E×B deflectors for adjusting the amount of deflection of the ions.

5. An ion micro beam apparatus according to claim 1, wherein each of the E×B deflectors generates the electric field and the magnetic field in directions perpendicular to one another and in directions perpendicular to the ion optical axis.

6. An ion micro beam apparatus according to claim 1, wherein the mass separating aperture means has an aperture thereof disposed along the ion optical axis.

7. An ion micro beam apparatus according to claim 1, wherein the mass separating aperture means has an aperture thereof disposed with a small deviation from the ion optical axis in the direction of the electric field of the E×B deflector of the first stage.

* * * * *